(12) United States Patent
Baba et al.

(10) Patent No.: US 6,594,129 B1
(45) Date of Patent: Jul. 15, 2003

(54) METHOD OF CUTTING OFF CIRCUIT UNDER OVERCURRENT, CIRCUIT CUTTING-OFF DEVICE UNDER OVERCURRENT, AND METHOD OF PROTECTING SEMICONDUCTOR RELAY SYSTEM

(75) Inventors: Akira Baba, Shizuoka (JP); Yoshikazu Nagashima, Shizuoka (JP); Kazuto Sugiyama, Shizuoka (JP); Yoshihiko Mine, Aichi (JP)

(73) Assignee: Yazaki Corporation, Tokyo (JP)

( * ) Notice: Subject to any disclaimer, the term of this patent is extended or adjusted under 35 U.S.C. 154(b) by 77 days.

(21) Appl. No.: 09/667,778

(22) Filed: Sep. 22, 2000

(30) Foreign Application Priority Data

Sep. 22, 1999 (JP) ............................. 11-269433
Sep. 22, 1999 (JP) ............................. 11-269446

(51) Int. Cl.⁷ ................................................ H02H 3/18
(52) U.S. Cl. ........................................... 361/87; 363/56
(58) Field of Search ............................. 361/87, 18, 71, 361/74, 90, 91, 103, 100, 274, 86, 94; 363/56, 60

(56) References Cited

U.S. PATENT DOCUMENTS 4,924,344 A * 5/1990 Guajardo ................... 361/101
5,367,424 A * 11/1994 Even ............................. 361/18
5,638,246 A * 6/1997 Sakamoto et al. .......... 361/103

* cited by examiner

*Primary Examiner*—Rajnikant B. Patel
(74) *Attorney, Agent, or Firm*—Sughrue Mion, PLLC

(57) ABSTRACT

In a semiconductor relay system for supply a power source to a lamp load under the on/off control by a microcomputer using a semiconductor relay, a method of cutting off a circuit under an overcurrent, a first prescribed value is which is a current value higher than a rated load current for the load and a maximum current value supplied to the lamp load, and a second prescribed value is set which is a current value between said first prescribed value and said rated current value; the current value flowing through the lamp load is sampled at predetermined time intervals and comparing the current value thus sampled with the second prescribed value; and when a higher current than said first prescribed value flows through the lamp load, the current supplied to the lamp load is controlled within a prescribed range between said first prescribed value and said second prescribed value, and when the sampled current value higher that said second prescribed value is counted by a prescribed number of times, the sampled current is decided as an overcurrent thereby cutting off the semiconductor relay to stop the current supply to said lamp load.

8 Claims, 8 Drawing Sheets

VERTICAL AXIS: 5A/DIVISION
HORIZONTAL AXIS: 100μSEC/DIVISION

FIG. 7

| SYSTEM | CONSTANT CURRENT | SHUT DOWN | PULSE WIDTH CONSTANT | PWM |
|---|---|---|---|---|
| METHOD | CONSTANT CURRENT | OUTPUT "OFF" | ON/OFF TIME CONSTANT | ON/OFF CONTROL |
| LAMP DRIVING OUTPUT CURRENT SOURCE | | | | |
| LAMP DRIVING CAPABILITY | ○ | × | × | ○ |
| LOAD SHORT-CIRCUIT STRENGTH | × | ○ | ○ | ○ |

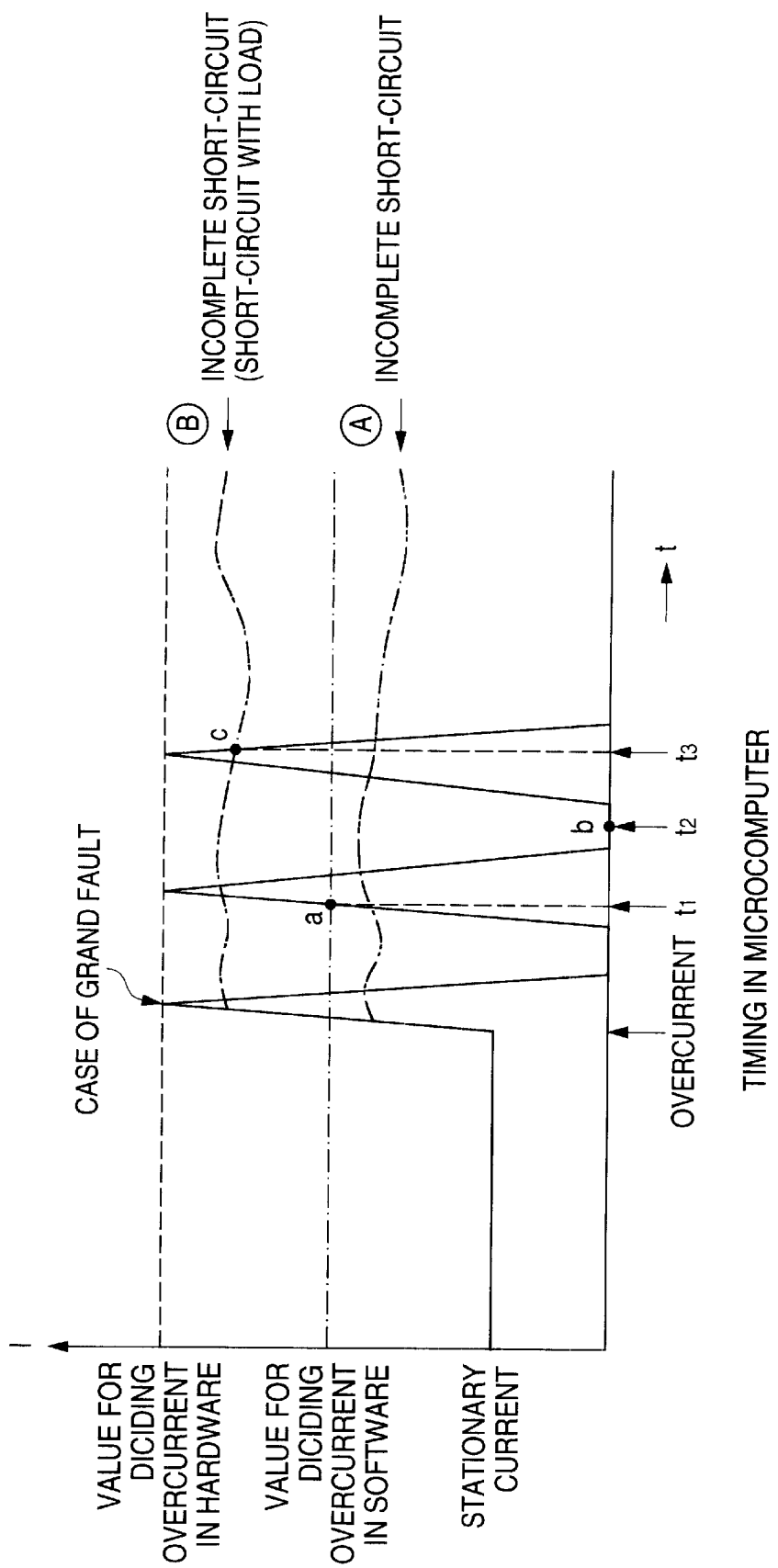

METHOD OF CUTTING OFF CIRCUIT UNDER OVERCURRENT, CIRCUIT CUTTING-OFF DEVICE UNDER OVERCURRENT, AND METHOD OF PROTECTING SEMICONDUCTOR RELAY SYSTEM

BACKGROUND OF THE INVENTION

1. Technical Field

The present invention relates to a semiconductor relay system using a semiconductor relay, and more particularly to a method for cutting off a current flow flowing to a load by a way of a microcomputer which surely detects an overcurrent when the overcurrent flows through the load due to short-circuit, and a circuit cutting-off device under the overcurrent.

2. Related Art

Generally, in a vehicle, power from an on-board battery is supplied to loads arranged at individual portions of the vehicle through a power MOSFET and a power source line covered with an insulating coating. The power source line is arranged along a vehicle body in an engine room which is vibrating all the time. In this case, if the power source line is located in the vicinity of the corner of a car body, its intermittent contact with the corner will be repeated by e.g. vibration. Further, if it continues for a long time, the coating of the power source line will be gradually cut away by the corner, and hence the inner conductive line may be exposed slightly. In such a case, the exposed portion of the power source line will be brought into contact with the car body. This leads to dead shorting or rare shorting in the power source line so that an overcurrent flows.

In recent years, a power MOSFET or IPS (Intelligent Power Switch) has been used as a semiconductor relay for a motor vehicle. In order to prevent heat generation of a device, a current limiter system as shown in FIG. 7 has been adopted in the semiconductor relay or IPS. The constant current system is a method of controlling a load current in fixed level by cutting down a gate voltage of FET under a voltage of steady state. Shutdown system is a method cutting the load current immediately after flowing overcurrent. Pulse width constant system is a method of cutting the load current intermittent while the overcurrent is flowed. PWM (Pulse Width Modulation) is a method of controlling a current level and a current applying time. For example, where an inrush current, which represents a large current flowing through a lamp load when a lamp switch is turned on, is taken in consideration, a PWM (Pulse Width Modulation) system in which the power MOSFET is completely turned off at a prescribed overcurrent is optimum. However, as shown in FIG. 8, when an overcurrent flows because of any cause (e.g. ground fault) while a current flows through a lamp load (a stationary current is supplied), the PWM system lowers the current flowing through the lamp load to zero. Therefore, to sample the current value at regular intervals using a microcomputer to read a current monitored value, since the sampled value may fall on the case where the current flowing through the lamp load is zero, like timing t2 in FIG. 8, the overcurrent could not be correctly monitored in software.

If there is an incomplete short-circuiting A of FIG. 8 in which a current not reaching a reference value for deciding the overcurrent in software flows, the overcurrent cannot be decided in software so that thermal stress is applied to the device (in the case of an normal FET). In the case of an incomplete short-circuiting B of FIG. 8, even when the decision in hardware cannot be made, the thermal stress is given to the device for a long time. Therefore, a thermal cutoff circuit incorporating type MOSFET (hereinafter referred to as a thermal FET) is also difficult to lengthen its life.

The conventional overheat cutoff function or overcurrent protection function incorporating the IPS is only the function of the self-protection, but does not consider protecting the wire harness or circuit arranged in a vehicle. Therefore, the conventional semiconductor relay or IPS has a disadvantage that it can execute the overheat cutoff in order to prevent heat generation, but cannot smoothly cut off the circuit under the overcurrent.

In above relay system, it was proposed to used a switching element of a thermal MOSFET that incorporates a thermal self-interrupting circuit and is cut off irrespectively of the voltage applied to a gate by its self-cutoff function. In this system, where a current larger than a prescribed current flows because of any cause (e.g. ground fault) while a current flows through the lamp load (i.e. a stationary current is supplied, generally), it is detected that the overcurrent flows through the lamp load at a prescribed time, thereby cutting off the thermal MOSFET. However, where it is not detected that the overcurrent has flowed through the lamp load, when the temperature of the thermal MOSFET exceeds its own thermal cutoff temperature as a result that the current has continued to flow through the thermal MOSFET, the thermal MOSFET is self-cutoff, thereby stopping the current supply to the lamp load.

Thus, the state where the current is not supplied to the lamp load includes two cases of: cutoff of the thermal MOSFET based on the general overcurrent control and cutoff of the thermal MOSFET based on the self-cutoff due to the heat generation of the thermal MOFET. Both these two cases are directed to stopping of the current supply to the lamp load by cutoff of the thermal MOSFET.

On the other hand, the thermal MOSFET has a life, and is particularly sensitive to heat stress. If it suffers the heat stress exceeding its own thermal cutoff circuit incorporating temperature and repeats the self-cutoff, the thermal MOSFET will be broken. Namely, the thermal MOSFET has the life attributed to the number of times of self-cutoff that is repeated whenever it suffers the heat stress to exceed the heat cutoff temperature. If the number of times exceeds that corresponding to the life, the thermal MOSFET will be broken.

Particularly, where the self-cutoff is repeated a number of times in an atmosphere at a low temperature (below the freezing point), it takes a time for the temperature of the thermal MOSFET to rise from the low temperature (below the freezing point) to the thermal cutoff temperature. In this case, the thermal MOSFET suffers more heat stress than when its temperature rises from the normal temperature to the thermal cutoff temperature. Therefore, the limitation of number of times becomes stricter to the repeat of the self-cutoff of the thermal MOSFET in the atmosphere at the low temperature (below the freezing point) than that in the normal temperature.

Where the self-cutoff is repeated a number of times in the atmosphere at a low temperature, particularly the heat generated in a chip is conducted to a stem thereof, the thermal MOSFET suffers heat stress so that it will be broken (e.g. number of times of endurance). The breakage may be attributable to "Al spike" and "Al slide". The Al spike refers to the fact that when the device instantaneously reaches a high temperature and repeatedly exceeds Tch (four channel temperature), the Al junction portion is fatigued and the resistance increases so that heat generation is accelerated. Hence the Al electrode layer will be molten and diffused into silicon, and eventually the device will break down. The Al slide refers to the fact that owing to the difference between a package material and a chip material in their heat expansion, the Al wiring at a chip corner slides and eventually the device will break down.

When the thermal MOSFET breaks down, the reliability of the entire semiconductor relay system which is used as a switching device is deteriorated. Therefore, it is necessary to count the number of times the self-cutoff made as a result that the thermal cutoff circuit incorporating MIDFET has suffered the heat stress, and carry out the processing such as issuing warning before the thermal MOSFET breaks down.

However, as described above, the cutoff of the thermal MOSFET occurs two cases of that based on the general overcurrent control and that based on the self-cutoff due to the heat generation of the thermal MOFET. Conventionally, both in these two cases cannot be distinguished from each other so that the number of times of the self-cutoff made as a result that the thermal MOSFET has suffered heat stress cannot be counted.

SUMMARY OF THE INVENTION

An object of the present invention is to enable the overcurrent due to the short-circuiting on the side of a load to be sufficiently decided, and where a thermal cutoff circuit incorporating type MOSFET is used, to enable the overcurrent to be decided by the overheat cutoff function of the MOSFET itself even when the power loss at the time of control is great.

An object of the present invention is to enable the number of times of self-cutoff due to heat generation of a thermal MOSFET to be counted accurately.

In order to attain the above object, a method of cutting off a circuit under an overcurrent in a semiconductor relay system for supplying a power source to a load, the method includes the steps of:

setting a first prescribed value which is a current value higher than a rated load current for the load and is a maximum current value supplied to the load;

setting a second prescribed value which is a current value between the first prescribed value and the rated current value;

sampling a current value flowing to the lamp load at predetermined intervals;

comparing the sampled current value with the second prescribed value;

controlling the current supplied to the load within a range between the first prescribed value and the second prescribed value in case of the sampled current higher than the first prescribed value flows to the load; and deciding the sampled current as an overcurrent and cutting off the semiconductor relay to stop the current supply to the load in case of the sampled current value higher than the second prescribed value is counted by a predetermined number of times.

In this configuration, the invention permits sufficient decision of an overcurrent due to short-circuiting on the side of the load.

In order to attain the above object, in the method of cutting off a circuit, the second prescribed value is several times as large as the rated load current.

In this configuration, when the overcurrent flows to the side of the load owing the short-circuiting, it can be surely detected.

In order to attain the above object, a circuit cutoff device having a semiconductor relay system for supplying a power source to a load under on/off control by a semiconductor relay of a microcomputer, the circuit cutoff device includes:

a first setting device setting a first prescribed value which is a current value as maximum current value supplied to the load, having a current detection resistor connected to a drain side of the semiconductor relay for detecting a current supplied to the load;

a comparator comparing a resistance voltage at both ends of the current detector resistor to a first prescribed voltage defined by the first prescribed value;

a hysteresis circuit applying a hysteresis having a prescribed width defined by the first prescribed voltage and a second prescribed voltage lower than the first prescribed voltage to the resistance voltage;

a gate logic circuit controlling a gate voltage of the semiconductor relay for stopping supplying the power source to the load according to an output from the comparator in case of the current exceed the first prescribed value, and controlling the gate voltage for supplying the power source to the load in case of the current lower than the second prescribed voltage; and a second setting device setting a second prescribed value which is a current value lower than the first prescribed value and higher than a rated current supplied to the load in a stationary state.

In this configuration, in accordance with the invention, the overcurrent due to the short-circuiting on the side of a load can be sufficiently decided. In addition, even when the power loss at the time of control is great, the overcurrent can be detected using the overheat cutoff function of a thermal cutoff circuit incorporating type MOSFET itself.

In order to attain the above object, in the circuit cutoff device under an overcurrent, the semiconductor relay is a thermal cutoff circuit incorporating MOSFET.

In this configuration, in accordance with the invention, the overcurrent due to the short-circuiting on the side of a load can be sufficiently decided. In addition, even when the power loss at the time of control is great, the overcurrent can be detected using the overheat cutoff function of a thermal cutoff circuit incorporating type MOSFET itself.

In order to attain the above object, in the circuit cutoff device under an overcurrent, the second prescribed value is set at a current value which is several times as large as a rated load current.

In this configuration, in accordance with the invention, when the overcurrent flows to the side of the load owing the short-circuiting, it can be surely detected.

In order to attain the above object, the circuit cutoff device under an overcurrent, wherein the second prescribed value is set by software in the microcomputer.

In this configuration, in accordance with the invention, when the overcurrent flows to the side of the load owing the short-circuiting, it can be surely detected by the software in the microcomputer.

An object of the present invention is to enable the number of times of self-cutoff due to heat generation of a thermal MOSFET to be counted accurately.

In order to attain the above object, a method of protecting a semiconductor relay system including a thermal interrupting circuit incorporating type MOSFET, a microcomputer and a driving circuit, the MOSFET being on/off controlled by the microcomputer through the driving circuit so that the semiconductor relay system supplying a power source to a load, the method includes the steps of:

detecting a current supplied to the load;

controlling the driving circuit to cut off a voltage applied to a gate of the MOSFET so that supply of the power source to the load is stopped when the detected current is larger than a prescribed current value set at larger than a rated current value;

detecting a source voltage generated on a source side of the MOSFET while an instruction signal for turning on the MOSFET is outputted from the microcomputer;

counting a number of times which the detected source voltage is lower than a prescribed voltage value; and turning off the semiconductor relay system for fear of reset when the counted number reaches a prescribed number of times.

In this configuration, the number of times of self-cutoff due to heat generated of a thermal MOSFET can be accurately counted.

In order to attain the above object, in a method of protecting a semiconductor relay system, the prescribed number of times is fewer than a number of times, defined by a characteristic of the MOSFET, that the MOSFET is broken of repetition of cutoff by a thermal self cut-off circuit incorporated in the MOSFET in state where a current limitation is imposed on a prescribed current value. In this configuration, the number of times of self-cutoff due to heat generated of a thermal MOSFET can be accurately counted.

BRIEF DESCRIPTION OF THE DRAWINGS

FIG. 7 is a view showing a conventional current limiter system.

FIG. 8 is a characteristic view of overcurrent cutoff for explaining the overcurrent control by a conventional PWM system.

DETAILED DESCRIPTION OF PREFERRED EMBODIMENT

First Embodiment

An explanation will be given of a first embodiment of the invention.

Figure 1:
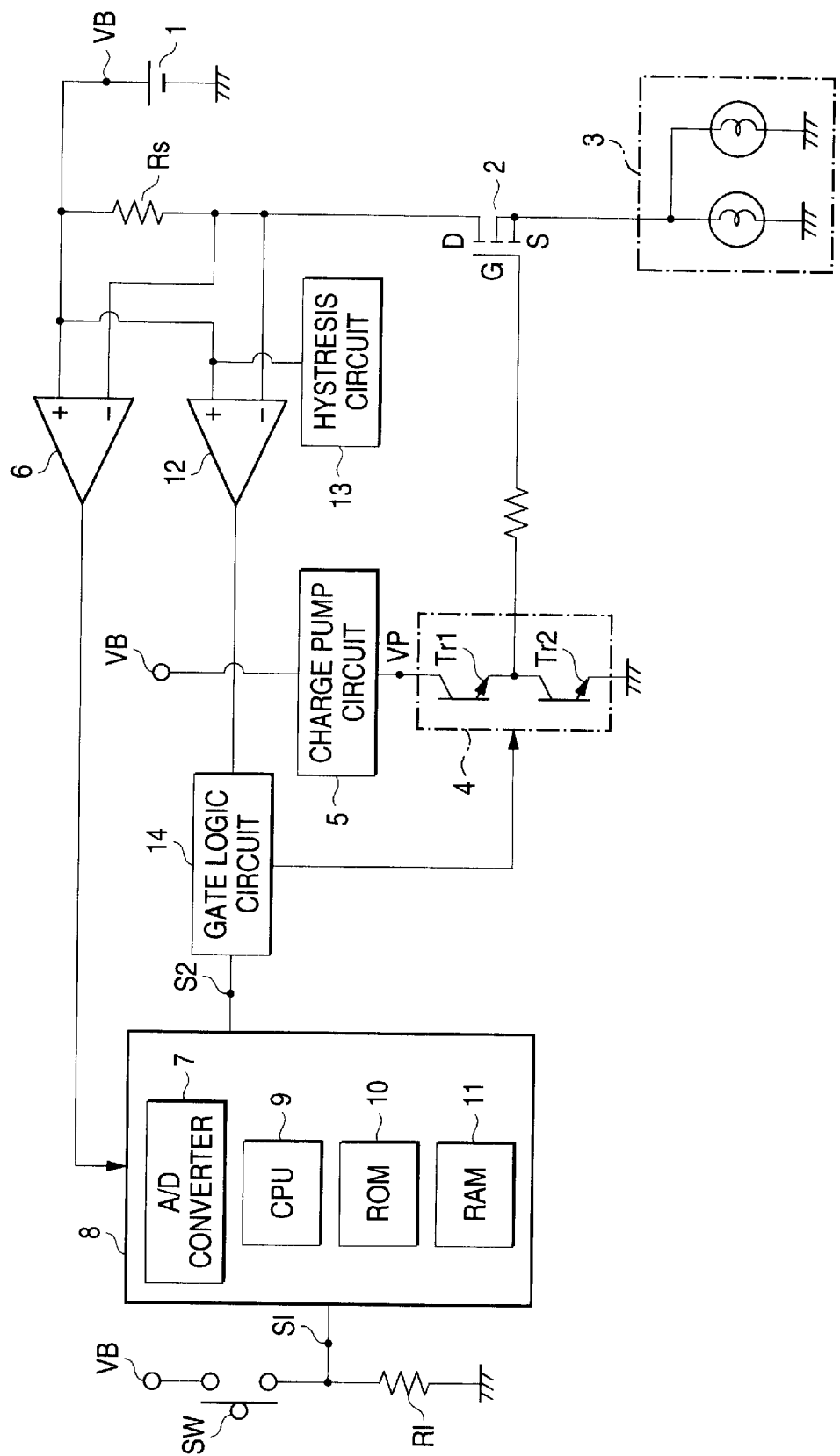
FIG. 1 is a circuit diagram showing a first embodiment of a method for cutting off a circuit under an overcurrent and a circuit cutoff circuit under the overcurrent according to a first embodiment of the invention.

FIG. 1 shows a first embodiment of a method of cutting off a circuit under an overcurrent and a circuit cutoff device under the overcurrent.

As shown in FIG. 1, a power supply voltage VB from an in-vehicle battery 1 is applied to a lamp load 3 such as a stop lamp and head light through a resistance Rs (shunt resistance) for detecting a current supplied to the load and a drain-source of a thermal cutoff circuit incorporating type MOSFET 2 (hereinafter referred as a thermal MOSFET) as a semiconductor switch element.

The thermal MOSFET 2 may be e.g. driving type power MOSFET having a logic level (not lower than 4V), which incorporates a thermal cutoff circuit so that the power MOSFET in an over-heated state can be protected. The system of cutting off overheat is a latch type which is restored at the zero-bias of a gate voltage after the overheat cutoff operation has been operated.

A driving circuit 4 includes: an NPN type switching (SW) transistor Tr1 with a collector supplied with a charge pump output voltage VP which has been boosted from a power source voltage by a charge pump; and an NPN type switching (SW) transistor Tr2 with a collector connected to the emitter of the SW transistor Tr1. The junction point between the emitter of the SW transistor TR1 and the collector of the SW transistor Tr2 is connected to a gate G of the thermal MOSFET 2.

By turning on the SW transistor Tr1 and turning off the SW transistor Tr2, the driving circuit 4 applies the charge pump output voltage VP supplied from the charge pump circuit 5 to the gate G of the thermal MOSFET so that the thermal MOSFET 2 is turned on.

By turning off the SW transistor Tr1 and turning on the SW transistor Tr2, the driving circuit 4 stop applying the charge pump output voltage VP supplied from the charge pump circuit 5 to the gate G of the thermal MOSFET so that the thermal MOSFET 2 is turned off.

The shunt resistor Rs arranged between the on-vehicle battery 1 and the thermal MOFET 2 is of low resistance to convert the current IL flowing through the power source line between the in-vehicle battery 1 and load 3 into a voltage. The current IL flowing through the power source line is detected by detecting the voltage across the resistor Rs as follows. Both ends of the shunt resistor are connected to a (+) input terminal and (−) input terminal of an amplifier 6. The amplifier 6 serves as a current detecting device which detects the current IL corresponding to the voltage across the shunt resistor Rs. The shunt resistor Rs is determined according to a value for determining an overcurrent (first prescribed value) in hardware, e.g. when the first prescribed value is several tens of ampere, the shunt resistor Rs is several tens of mΩ.

The output from the amplifier 6 is converted into a digital value by an A/D converter 7 and thereafter supplied into the microcomputer 8. The microcomputer 8 is connected to the one end of the external switch SW, the one end of which is connected to ground via a resistor R1 and the other end of which is connected to the power source voltage VB. When the switch SW is turned on, the microcomputer 8 is supplied with an ON operation signal S1 at an H level.

The microcomputer 8 incorporates the A/D converter 7, a CPU 9 which operates according to a prescribed control program, an ROM 10 which previously stores the control program, and an RAM 11 which temporarily stores the data required for the performance of a computation by the CPU 9. The microcomputer 8, when it is supplied with the ON operation signal S1 by the ON operation of the switch SW, produces a drive instructing signal S2 to a gate logic circuit 14.

A comparator 12 is connected across the shunt resistor Rs. The output terminal of the comparator 12 is connected to the gate logic circuit 14. The gate logic circuit 14 is connected to the driving circuit 4. A hysteresis circuit 13 is connected to the (+) input terminal of the comparator 12.

The comparator 12 produces a prescribed voltage with hysteresis corresponding to the voltages at both ends of the shunt resistor Rs by way of the hysteresis circuit 13 to the gate logic circuit 14. The comparator 12 supplies, to the gate logic circuit 14, an output for cutting off the gate voltage applied to the gate G of the thermal MOSFET 2. Thus, the current flowing through the shunt resistor Rs lowers. With a prescribed quantity of hysteresis of the current flowing through the shunt resistor Rs from the current flowed initially, the hysteresis circuit 13 causes the comparator 12 to produce an ON signal to the gate logic circuit 14 so that the gate voltage is applied to the gate G of the thermal MOSFET 2 again through the driving circuit 4. Such a current control continues until the drive instructing signal S2 issued from the microcomputer 8 to the gate logic circuit 13 stops. In this way, the hysteresis circuit 13 substantially determines the threshold value of the ON/OFF of the comparator 12.

An explanation will be given of the operation of the circuit cutoff device under the overcurrent thus configured.

Figure 2:
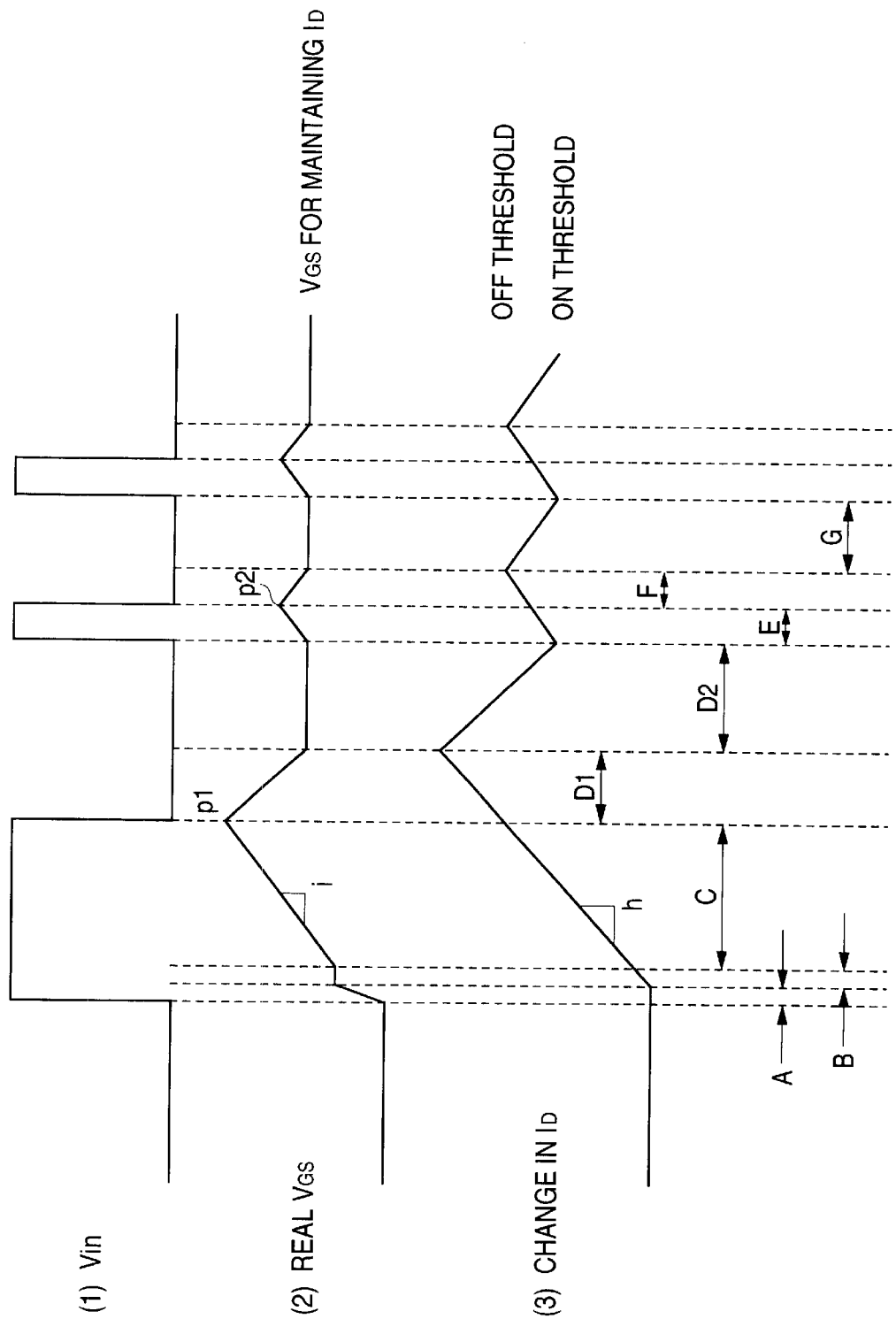
FIG. 2 is a timing chart for explaining the operation of a thermal MOSFET as shown in FIG. 1.

First, when a power is turned on, as shown in FIG. 2, a voltage Vin from the microcomputer 8 is applied to the gate logic circuit 14. This voltage is applied from the gate logic circuit 14 to the gate G of the thermal MOSFET 2 through the driving circuit 4. Then, the voltage VGS between the gate G and source S of the thermal MOSFET 2 is gradually boosted as seen from FIG. 2. In FIG. 2, symbol A represents the period from when Vin becomes "ON" to when Vgs of the thermal MOSFET 2 reaches a second prescribed voltage. Symbol B represents the period of a saturated region shifted from an active region when the thermal MOSFET 2 becomes completely "ON". Symbol C represents the period from VGS (th) to when the current ID starts to flow through the load. Symbol D1 represents the period while the Vin is "OFF" because the current ID passes through the "off" threshold of the comparator 12. Symbol D2 represents the period while the current ID through the load ID falls after the voltage between the gate G and source S of the thermal FET 2 lowers to the VGS for maintaining the peak current. Symbol E represents the period while Vin becomes "ON" after the current ID flowing through the load has passed the "on" threshold. Symbol F represents the period while the VGS between the gate G and source S lowers after the ID has passed the "off" threshold and Vin becomes off. Symbol G represents the period while the current ID continues to lower from when VGS has lowered to the VGS (on).

The microcomputer 8 samples, at prescribed intervals, the output from the amplifier 6 which has been converted in a digital value by the A/D converter 7. The microcomputer 8 compares the sampled current IL flowing through the load with the second prescribed value (prescribed current value) to determine whether or not the former exceeds the latter. When the microcomputer 8 counts, by a prescribed number of times, the status when the current IL flowing through the load has exceeded the second prescribed value, it detects an overcurrent Then, the microcomputer 8 stops supply of a drive instructing signal S2 to the gate logic circuit 14.

When the drive instructing signal S2 to the gate logic circuit 14 is "OFF", an application of the charge pump output voltage VP to the gate G of the thermal MOSFET is stopped.

Figure 3:
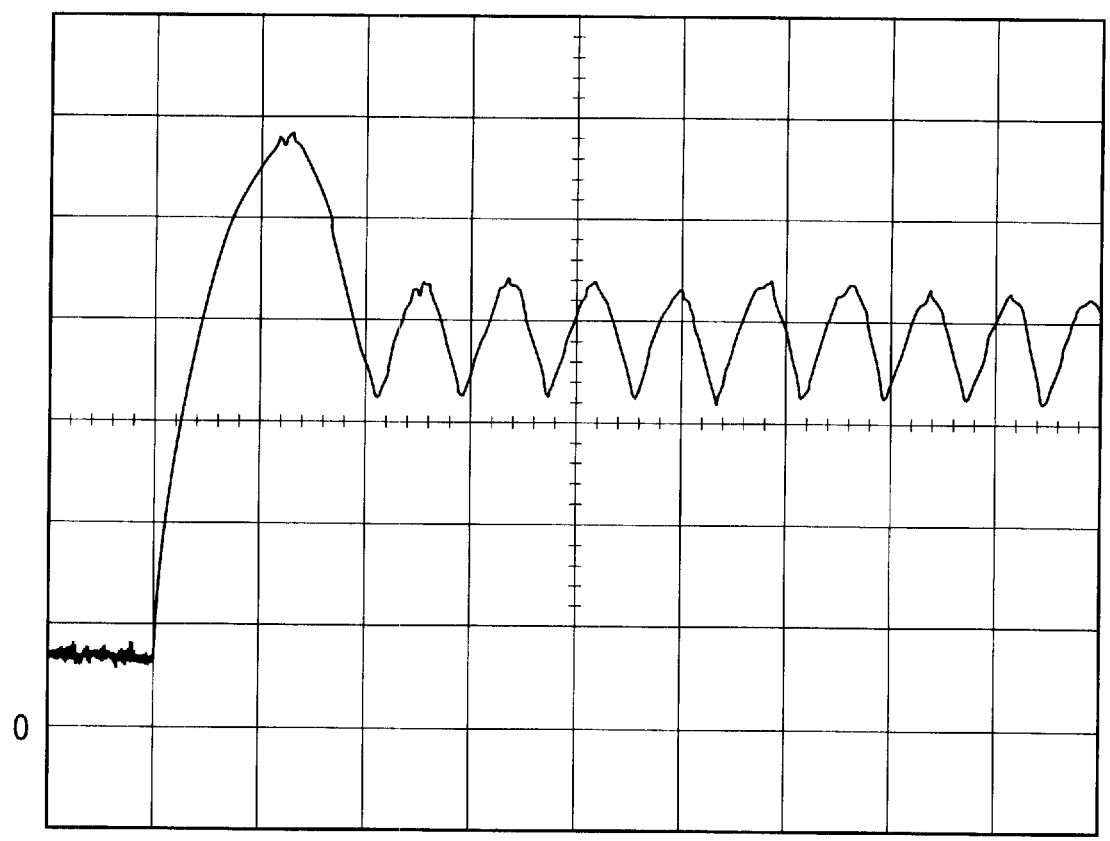
FIG. 3 is a view showing a constant current controlled waveform when ground default occurs.

FIG. 3 shows a constant-current controlled waveform when actual ground default occurs.

Figure 4:
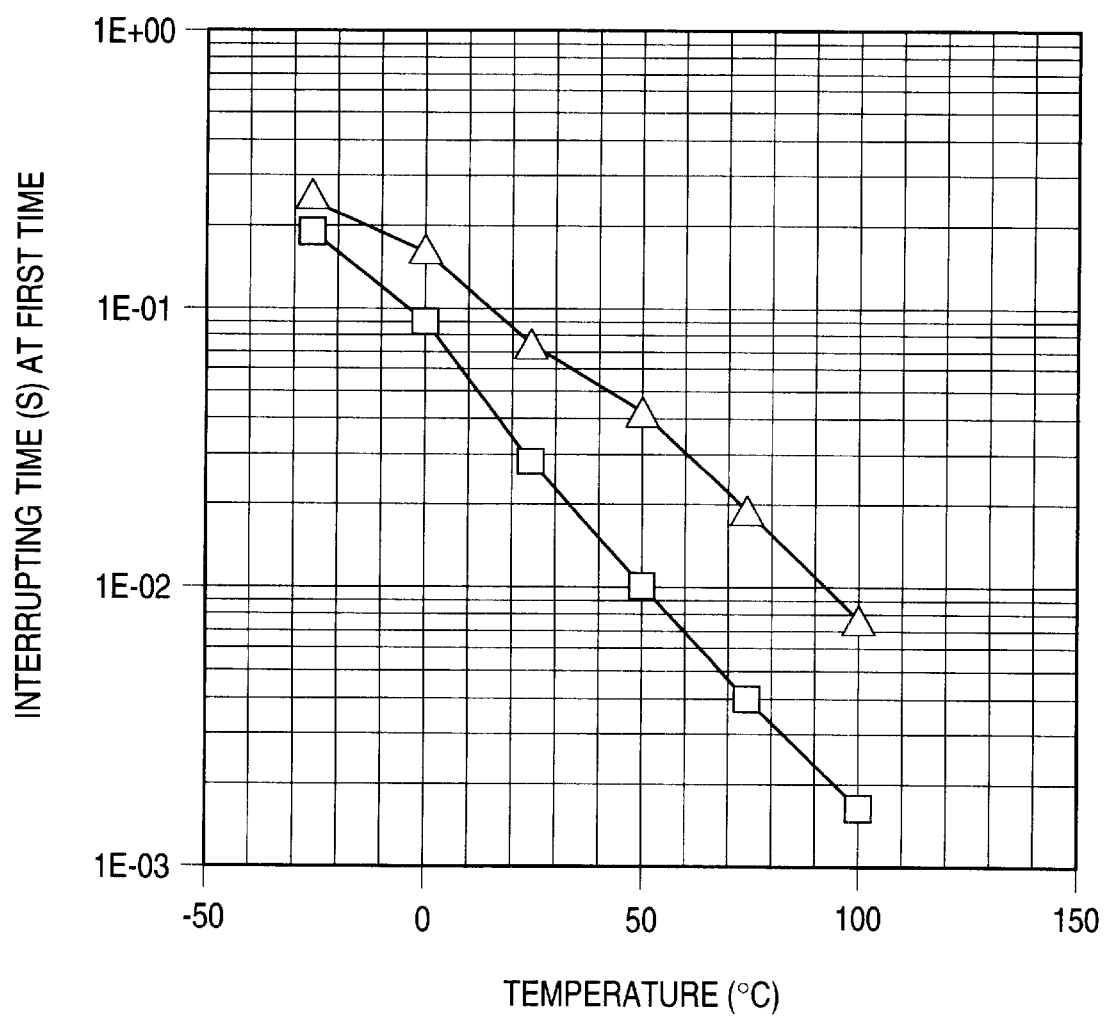
FIG. 4 is a graph showing the overheat cutoff time of the thermal MOSFET in the constant current control.

FIG. 4 is a graph showing the overheat cutoff time of the thermal MOSFET 2 in constant controlled control.

In this graph, mark Δ represents the overheat cutoff time in the constant current control of the thermal MOSFET at the cutoff temperature of 200° C. Mark □ represents that of at the cutoff temperature of 165° C. From the graph, it can be seen that the overheat cutoff for 30–70 msec occurs at the normal temperature.

This characteristic graph is obtained by causing the thermal MOSFETs having cutoff temperatures of 200° C. and 165° C. to generate heat to cut the current flow to the load. It can been seen that cutting the current flow through the load contributes to suppress the temperature rise in a wire harness.

Figure 5:
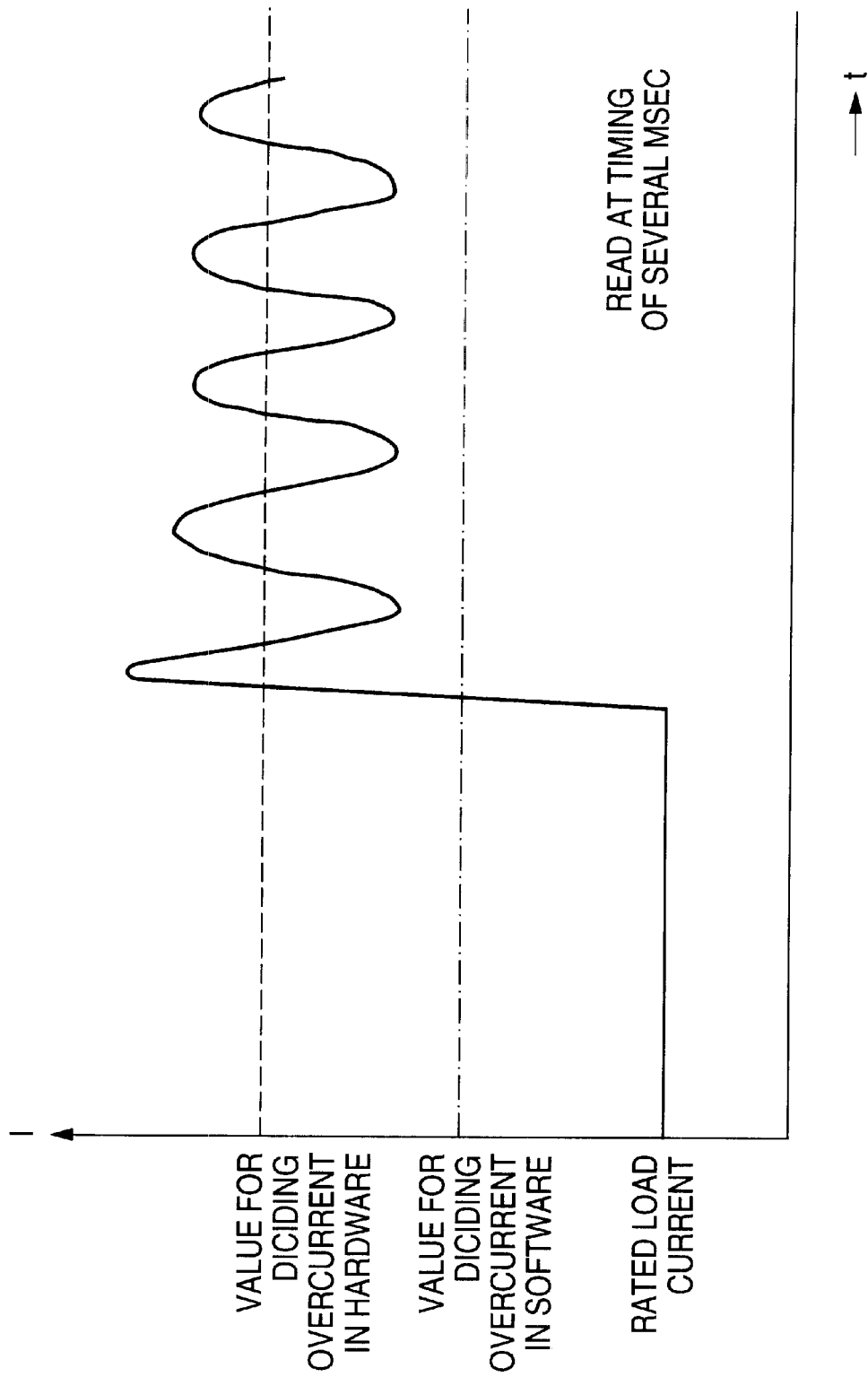
FIG. 5 is a view showing the current monitored state during the constant current control when the thermal MOSFET is actually used.

FIG. 5 shows the status of the constant current control when the thermal MOSFET is actually used as well as a monitored current.

In FIG. 5, the value for determining an overcurrent in hardware is several tens of amperes. In the case of ground fault, the current limitation is made at the period of about several tens of $\mu$sec. The value for determining the overcurrent in software is defined at a value twice as large as the rated load (21 W×2 lamps) to set the hysteresis of the comparator 12. In this case, the drop of the current is limited to the lower limit. Therefore, by making the current monitoring (sampling of the current value) (comparing the sampled current with the overcurrent determining value prescribed in the microcomputer), the overcurrent status can be read. In this case, the data sampling in the microcomputer 8 regards several times of read of several msec as the overcurrent status.

In the case of chattering short, where the load changes from "ON" to "OFF" in the shorted state, the current is detected from when a predetermined time elapses after the load becomes "ON". During the current detection, when several tens of number of times of the overcurrent are detected for one second, the microcomputer 8 determines this status as the overcurrent status. At this time, the microcomputer 8 stops supply of the drive instructing signal S2 to the gate logic circuit 14.

Incidentally, where the microcomputer 8 cannot recognizes the overcurrent status, the overheat cutoff is made by the overheat cutoff function of the thermal MOSFET 2 itself so that the temperature rise in the wire harness on the side of the load can be suppressed.

In this way, according to this embodiment, the constant current control (using the first prescribed value) for the current to be supplied to the load is made for the overcurrent due to the short-circuiting on the side of the load. Therefore, the sufficient decision of the overcurrent (comparisons of the detected current value with a second prescribed value) can be made without dropping the current value to the value of determining the overcurrent (second prescribed value) in the microcomputer the second prescribed value. Where the loss of power is great during the control, the control is made in such a manner that the MOSFET itself is cut off by its own overheat cutoff function so that the current does not flow to the load.

Second Embodiment

An explanation will be given of a second embodiment of the invention.

Figure 6:
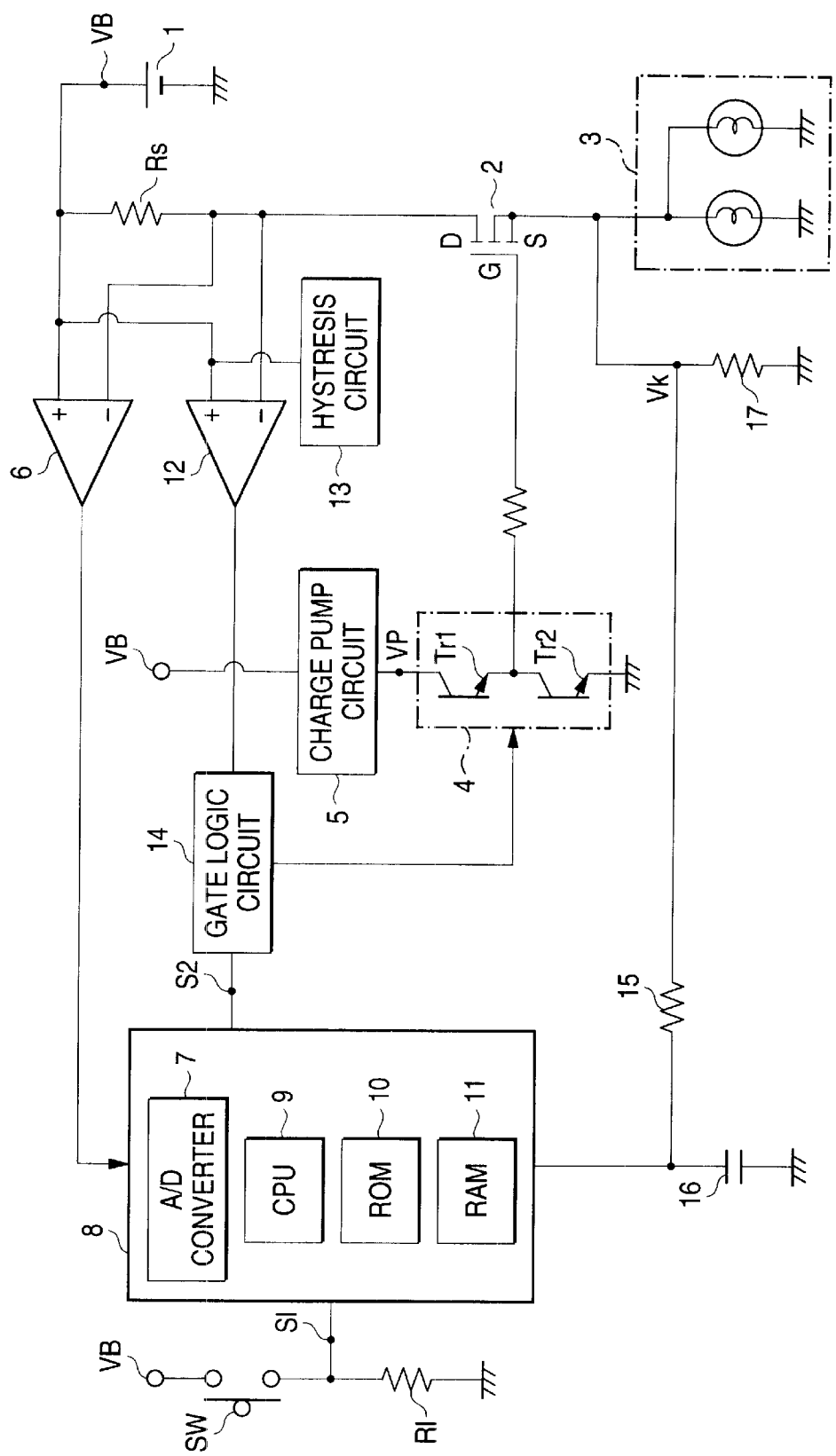
FIG. 6 is a circuit diagram showing a second embodiment of a method of protecting a semiconductor relay system according to the invention.

FIG. 6 shows an embodiment of a method of protecting a semiconductor relay system according to the invention.

In the drawings, the second embodiment differs from the first embodiment in providing resistors 15, 17 and a capacitor 15. In other respects, the first embodiment is identical with the second embodiment. Here, explanation will be given of only a difference unique to the second embodiment.

The one end of a resistor 17 is connected to the source S of the thermal MOSFET 2. The other end of the resistor 17 is connected to ground. The resistor 17 serves to detect the voltage Vk generated in the source S. The one end of the resistor 17 is also connected to the microcomputer 8 through a noise cut filter composed of a resistor 15 and a capacitor 16. Where the thermal MOSFET 2 is ON, the voltage Vk on the source side of the resistor 17 remains a constant value depending on the resistance of the resistor 17 and an applied voltage. It lowers to an approximately zero potential when the thermal MOSFET 2 is turned off.

An explanation will be given of the overcurrent cutoff detecting device for a semiconductor relay system constructed as described above and a method of protecting the semiconductor relay system.

In the circuit configuration of FIG. 6, the reference value for determining the overcurrent in hardware is set at several tens of amperes, and in case ground fault occurs, current limitation is made at a period of about several tens of $\mu$sec. The reference value for determining the overcurrent in software is set twice as large as a rated load (21 W×two lamps) current to set the hysteresis of the comparator 12. Such setting of the hysteresis provides a minimum value of drop of the current. Therefore, by executing the current monitoring (sampling of the current value) i.e. comparing the current with the overcurrent set by the microcomputer 8, the state of the overcurrent can be read. In this case, the data sampling by the microcomputer 8 admits the overcurrent state by the read of several times for every several msec.

As described above, in this embodiment, constant current control for the current supplied to the side of a load is made for the overcurrent due to the short-circuiting of the load side in such a manner that sufficient judgment (comparison of the detected current value with a reference current value) is made without lowering the current value below the value for determining the overcurrent (prescribed reference value) set by the microcomputer. At a prescribed time after the overcurrent has been detected, the gate voltage of the thermal MOSFET is shut down to turn off MOSFET so that no current flows to the thermal MOSFET. Such a current control refers to the controlled cutoff of the overheat based on the overcurrent.

When the thermal MOSFET itself is over-heated to a prescribed temperature because of the overcurrent due to the short-circuiting before the gate voltage of the thermal MOSFET is shut down to cut off the thermal MOSFET after a prescribed time, the thermal MOSFET is cut off by its own thermal self-cutoff function before the OFF signal is issued from the microcomputer. Otherwise, when the thermal MOSFET itself is over-heated a prescribed temperature because the overcurrent is incompletely detected due to the rare short-circuiting on the load side so that the control is not made of shutting down the gate voltage of the thermal MOSFET to cut off the thermal MOSFET, it is cut off by its own thermal self-cutoff function in the state where the OFF signal is not issued from the microcomputer. Such a current control refers to the overheat self-cutoff based on the overcurrent.

The overheat controlled cutoff based on the overcurrent and overheat self-cutoff based on the overcurrent are similar to each other in that the thermal MOSFET is cut off, but are greatly different from each other in that the former does not apply thermal stress to the thermal MOSFET whereas the latter applies the thermal stress to the thermal MOSFET.

The overheat controlled cutoff based on the overcurrent and overheat self-cutoff based on the overcurrent are distinguished from each other by the microcomputer 8. When the thermal MOSFET 2 is cut off, the voltage Vk on the source side of the resistor 17 connected to the thermal MOSFET 2 lowers to the potential of zero. This phenomenon occurs in both of the overheat controlled cutoff based on the overcurrent and overheat self-cutoff based on the overcurrent. Therefore, the microcomputer 8 reads the voltage Vk on the source side when the drive instructing signal S2 for turning on the thermal MOSFET is issued to the gate logic circuit 14 to determine whether the voltage Vk on the source side of the resistor 17 is at a constant voltage or substantially zero potential. If the voltage Vk on the source side is substantially zero potential in spite of outputting the drive instructing signal S2, it is determined that the thermal MOSFET 2 generates the overheat self-cutoff based on the overcurrent.

Generally, the thermal MOSFET, if it does not suffer the thermal stress, operates normally during the life of a motor vehicle. If it suffers the thermal stress (overheat self-cutoff), its life is shortened. If the thermal MOSFET repeats the self-cutoff while suffering the thermal stress exceeding its own thermal cutoff temperature, the MOSFET itself will be broken. Further, in an atmosphere below the freezing point, the thermal MOSFET will be broken by the overheat self-cutoff by the number of times less than a prescribed number of times.

If the thermal MOSFET is broken, the reliability of the entire semiconductor relay system using the switching element is deteriorated. Therefore, it is necessary to count the number of times of the self-cutoff made by the thermal MOSFET under the thermal stress and make processing such as issuing a warning before the thermal MOSFET is broken.

To this end, the number of times of the overheat self-cutoff based on the overcurrent is accumulatively counted and stored by the microcomputer 8. The counted value remains stored even if power is off. A certain number of times is set under consideration of safety on the basis of the number of times when the thermal MOSFET is broken (prescribed number of times in an atmosphere below the freezing point). In operation, when the counted value of the overheat self-cutoff due to the overcurrent reaches the prescribed number of times, the semiconductor relay system itself is turned off by the microcomputer 8 so that the it is not reset. In this way, the thermal MOSFET can be exchanged before it is broken under the application of the thermal stress. In addition, since the semiconductor relay system itself is turned off so that it is not reset, even if the thermal MOSFET is broken, repeated occurrence of the load short-circuiting (ground fault) is prevented so that failure of the wire harness is not generated.

The present invention, which is constructed as described above, provides the following effects.

In this configuration, in accordance with the invention, the overcurrent due to the short-circuiting on the side of a load can be sufficiently decided. In addition, even when the power loss at the time of control is great, the overcurrent can be detected using the overheat cutoff function of a thermal cutoff circuit incorporating type MOSFET itself.

In accordance with the invention, when the overcurrent flows to the side of the load owing the short-circuiting, it can be surely detected.

In this configuration, in accordance with the invention, the overcurrent due to the short-circuiting on the side of a load can be sufficiently decided. In addition, even when the power loss at the time of control is great, the overcurrent can be detected using the overheat cutoff function of a thermal cutoff circuit incorporating type MOSFET itself.

In accordance with the invention, the overcurrent due to the short-circuiting on the side of a load can be sufficiently decided. In addition, even when the power loss at the time of control is great, the overcurrent can be detected using the overheat cutoff function of a thermal cutoff circuit incorporating type MOSFET itself.

In accordance with the invention, when the overcurrent flows to the side of the load owing to the short-circuiting, it can be surely detected.

In accordance with the invention, when the overcurrent flows to the side of the load owing the short-circuiting, it can be surely detected by the software in the microcomputer.

In accordance with the invention, the number of times of self-cutoff due to heat generated of a thermal MOSFET can be accurately counted.

What is claimed is:

1. A method of cutting off a circuit under an overcurrent in a semiconductor relay system for supplying a power source to a load, said method comprising the steps of:

setting a first prescribed value which is a current value higher than a rated load current for the load and is a maximum current value supplied to the load;

setting a second prescribed value which is a current value between said first prescribed value and said rated current value;

sampling a current value flowing to the lamp load at predetermined intervals;

comparing said sampled current value with said second prescribed value;

controlling the current supplied to the load within a range between said first prescribed value and said second prescribed value in case of said sampled current higher than said first prescribed value flows to the load; and deciding said sampled current as an overcurrent and cutting off the semiconductor relay to stop the current supply to said load in case of said sampled current value higher than said second prescribed value is counted by a predetermined number of times.

2. A method of cutting off a circuit according to claim 1, wherein said second prescribed value is twice as large as the rated load current.

3. A circuit cutoff device having a semiconductor relay system for supplying a power source to a load under on/off control by a semiconductor relay of a microcomputer, said circuit cutoff device comprising:

a first setting device setting a first prescribed value which is a current value as maximum current value supplied to said load, having a current detection resistor connected to a drain side of said semiconductor relay for detecting a current supplied to said load;

a comparator comparing a resistance voltage at both ends of said current detector resistor to a first prescribed voltage defined by said first prescribed value;

a hysteresis circuit applying a hysteresis having a prescribed width defined by said first prescribed voltage and a second prescribed voltage lower than said first prescribed voltage to said resistance voltage;

a gate logic circuit controlling a gate voltage of said semiconductor relay for stopping supplying said power source to said load according to an output from said comparator in case of said current exceed said first prescribed value, and controlling said gate voltage for supplying said power source to said load in case of said current lower than said second prescribed voltage; and a second setting device setting a second prescribed value which is a current value lower than said first prescribed value and higher than a rated current supplied to said load in a stationary state.

4. A circuit cutoff device according to claim 3, wherein said semiconductor relay is a thermal cutoff circuit incorporating type MOSFET.

5. A circuit cutoff device according to claim 3, wherein said second prescribed value is set at a current value which is twice as large as a rated load current.

6. A circuit cutoff device according to claim 3, wherein said second prescribed value is set in said microcomputer.

7. A method of protecting a semiconductor relay system including a thermal interrupting circuit incorporating type MOSFET, a microcomputer and a driving circuit, said MOSFET being on/off controlled by said microcomputer through said driving circuit so that said semiconductor relay system supplying a power source to a load, said method comprising the steps of:

detecting a current supplied to said load;

controlling said driving circuit to cut off a voltage applied to a gate of said MOSFET so that supply of said power source to said load is stopped when said detected current is larger than a prescribed current value set at larger than a rated current value;

detecting a source voltage generated on a source side of said MOSFET while an instruction signal for turning on said MOSFET is outputted from said microcomputer;

counting a number of times which said detected source voltage is lower than a prescribed voltage value; and turning off said semiconductor relay system for fear of reset when said counted number reaches a prescribed number of times.

8. A method of protecting a semiconductor relay system according to claim 7, wherein said prescribed number of times is fewer than a number of times, defined by a characteristic of said MOSFET, that said MOSFET is broken of repetition of cutoff by a thermal self cut-off circuit incorporated in said MOSFET in state where a current limitation is imposed on a prescribed current value.

* * * * *